United States Patent [19]
Zur et al.

[11] Patent Number: 5,331,280
[45] Date of Patent: Jul. 19, 1994

[54] EVOLVING IMAGE

[75] Inventors: Yuval Zur, Haifa; Haim Rotem, Matay Asher; Dan Rosenfeld, Haifa, all of Israel

[73] Assignee: Elscint Ltd., Haifa, Israel

[21] Appl. No.: 991,941

[22] Filed: Dec. 17, 1992

[30] Foreign Application Priority Data

Dec. 26, 1991 [IL] Israel ..................................... 100530

[51] Int. Cl.$^5$ ........................................... G01R 33/20
[52] U.S. Cl. .................................................... 324/309
[58] Field of Search ............... 324/300, 307, 309, 310, 324/311, 312, 313, 314, 318, 322; 128/653.2, 653.5

[56] References Cited

U.S. PATENT DOCUMENTS

| 4,721,912 | 1/1988 | Kaufman et al. | 324/309 |
| 4,888,552 | 12/1989 | Egozi et al. | 324/309 |
| 4,950,991 | 8/1990 | Zur | 324/307 |
| 4,973,111 | 11/1990 | Haacke et al. | 324/309 |
| 4,998,064 | 3/1991 | Fuderer et al. | 324/309 |

Primary Examiner—Michael J. Tokar
Attorney, Agent, or Firm—Sandler, Greenblum & Bernstein

[57] ABSTRACT

A magnetic resonance imaging system that:
applies gradient pulses in a sequence that elicits large amounts of data early in a scan to provide an evolving image; and reduces the Gibbs artifacts to increase the utility of the evolving images.

20 Claims, 4 Drawing Sheets

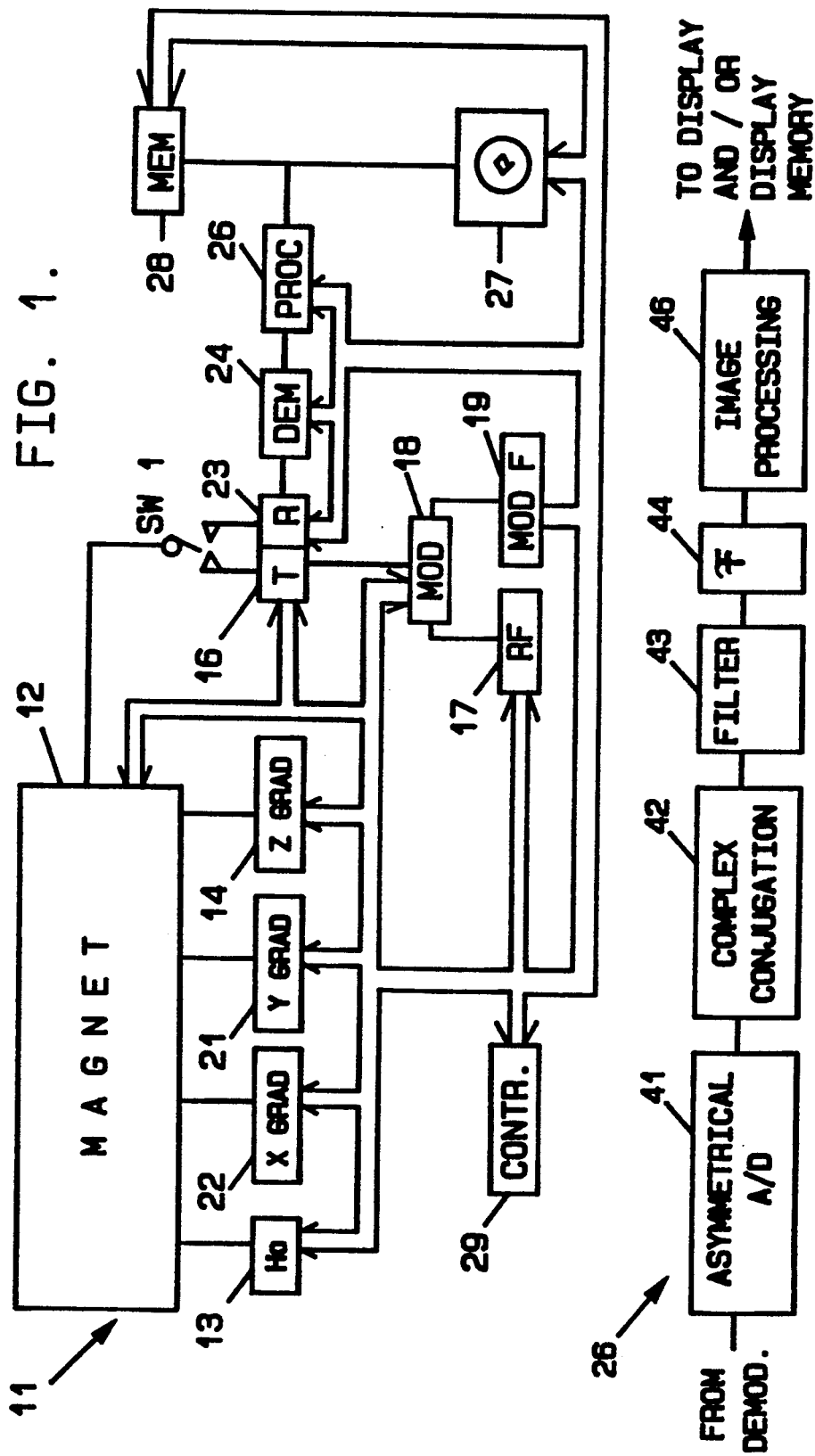

EVOLVING IMAGE

FIELD OF THE INVENTION

This invention relates to systems, that is apparatus and methods for magnetic resonance imaging (MRI) and more particularly, with apparatus and methods for obtaining magnetic resonance images during data acquisition in an evolving manner. In such systems images are displayed practically from the onset of the acquisition process. This invention is an improvement over the invention of the U.S. Pat. No. 4,888,552 assigned to the Assignee of this invention.

BACKGROUND OF THE INVENTION

Imaging using MRI systems in the past required that data acquisition be substantially completed prior to image reconstruction. The reconstruction of the images in MRI systems is accomplished by transforming the data acquired using two-dimensional Fourier transforms. The data acquisition scan in the past proceeded from an edge of a two-dimensional Fourier transform plane through the center of the plane to an opposite edge. Most of the data is actually acquired around the center of the Fourier transform plane. Thus, in the past, it was necessary for the MRI system to first acquire at least more than half of the data prior to processing the data to provide the image.

Subsequently, apparatus and methods were promulgated, see for example, U.S. Pat. No. 4,888,552 referred to hereinabove, wherein the acquisition proceeds from the center or near the center of the Fourier transform plane outwardly enabling the almost immediate processing of the data to provide the image.

However, the acquisition from the center outwards often causes artifacts, especially Gibbs artifacts. One of the reasons for the Gibbs artifacts in the evolving images is that the sampling time is extremely limited. See, for example, U.S. Pat. No. 4,950,991, which issued on Aug. 21, 1990, and is based on Israeli Patent Application 86570 filed on May 31, 1989, and the Israeli Patent Application 098053 filed on May 3, 1991, both assigned to the Assignee of this Application. The contents of the patent and the later filed application are hereby incorporated herein.

A signal representation in the image domain near a discontinuity, for example, includes an "oscillatory overshoot" which is approximately 9% of the magnitude of the signal at the discontinuity. When few sampling points are available; i.e., in the early phases of the evolving image, the 9% amplitude is approximately in the center of the discontinuity. As more sampling points are taken the overshoot is compressed towards the edge of the discontinuity which reduces the effects of the artifact to improve the spatial resolution.

Accordingly, during evolving image processing, when few sampling points are available, the Gibbs artifact is especially pronounced making the early images of the evolving image virtually illegible for diagnostic purposes.

Data acquisition requires that a patient being imaged be placed in a strong static magnetic field. The strong static magnetic field aligns the protons of certain elements within the body. The aligned protons are exposed to RF pulses which nutate the aligned protons into a plane transverse to the static magnetic field when the frequency of the RF pulses is the Larmor frequency.

After the application of the RF pulses, the nutated protons rotate in the transverse plane and also dephase and tend to realign themselves with the magnetic field. The signals due to the movement of the nutated protons in the transverse plane generally are known as free induction decay (FID) signals which are proportional to the density of the nutated protons. These signals are used as raw data for reconstructing images or else echo procedures are used for rephasing the FID signals periodically to obtain what are known as echo signals. The echo signals are then used as raw data for reconstructing the images. The raw data is preferably transformed using two-dimensional Fourier transforms to obtain data for image pixels which correspond to locations in the patient.

The locations of the detected FID signals (herein "FID signals" include either FID signals themselves or the echo signals) are obtained in a well known manner using gradient pulses.

In the prior art, in general, image reconstruction does not commence until at least half of the phase encoding gradient pulses have been applied. In the past, in general, the first phase encoding gradient pulse applied was the maximum negative phase encoding gradient pulse followed by the maximum negative plus one phase encoding gradient pulse and sequentially through to the maximum positive phase encoding gradient pulse.

As is well known, at the zero value of a phase encoding gradient pulses, the received signal is generally largest; i.e., most of the data is acquired. That is why image reconstruction could not start until at least the zero phase encoding gradient was applied; i.e., until at least half the phase encoding gradients were applied. Where only half of the phase encoding gradients were used, computations were necessary to construct the other half of the data. As is recognized in the U.S. Pat. No. 4,721,912 and in the '552 Patent referred to above, if data reconstruction could be accomplished on line; i.e., while the data acquisition was in process; then, valuable throughput time would be saved. Where the image is reconstructed on-the-fly as in the '552 and the '912 patents, the clinician does not have to wait for complete image data to determine the efficacy of the imaging procedure being used. If the image location is wrong, for example, the clinician can restart the procedure and move the selected slice early in the data acquisition process without having to wait for the entire data acquisition. Time-saving is also effected by not having to wait for all the data to be acquired before reconstruction of the image starts, because as the data acquisition proceeds, the image becomes progressively clearer. Thus, when the physician obtains sufficient information, usually prior to the acquisition of all the scheduled data, he can stop the data acquisition process.

The evolving images early in the evolving image process, have low resolution, but have a high signal-to-noise ratio; thereby, theoretically compensating for the low resolution. However, such evolving images are adversely affected by the Gibbs artifacts to the point of demeaning the usefulness of the partial images for diagnostic purposes. The '552 Patent improved on the '912 Patent by, among other things, starting acquisition away from the zero point during the initial system instability; then after a fixed number of encoding gradients, during which the system stabilized, acquiring data at the zero point. However, because of the paucity of data, the Gibbs artifacts still remained and were pronounced. Notwithstanding the improved signal-to-noise ratio of the evolving images, the Gibbs artifacts degraded the evolving image to an extent wherein the evolving image procedure in many cases was hardly useful.

Accordingly, it is an object of the present invention to further improve on the "evolving image" procedure by reducing the artifacts through asymmetrical sampling, complex conjugating and filtering of the acquired signal which is particularly effective vis-vis the Gibb's artifact. Without the Gibbs artifact, the improvement in the legibility of the image during the evolving image process is readily apparent, Thus, without the Gibbs artifact, the relatively high SNR of the early evolving images provides a good useful legible image in pereceptibly less acquisition time.

A related object of the present invention is a reduction of the Gibb's artifact without adversely affecting the resolution, the SNR or the scan time of evolving images.

Yet another related object of the present invention is to provide methods and systems for acquiring usable relatively Gibbs artifact-free images on the fly in MRI systems; i.e., to provide MRI systems wherein image reconstruction commences almost simultaneously with image acquisition and nonetheless Gibbs artifacts are greatly minimized. Thereby maximizing the legibility and usefulness of even the early evolving images.

BRIEF DESCRIPTION OF THE INVENTION

According to a broad aspect of the present invention, a method for acquiring data for use in reconstructing images during data acquisition in magnetic resonance imaging systems is provided, said method comprising the steps of:

placing a subject for imaging in a large static magnetic field, acquiring data from a selected section of the subject, said acquiring step comprising:

asymmetrically applying a series of encoding pulses in a preset order starting at or close to the zero, point where maximum data is acquired, said encoding pulses being applied prior to the receipt of FID signals for obtaining data, applying view gradient pulses during the acquisition of said signals for obtaining projection data in the view gradient direction, transforming said data, displaying evolving image using said transformed data, reducing the Gibbs artifacts in the displayed evolving images by:
1) storing preselected optimized controllable parameters such as filter characteristic and asymmetry ratio R.
2) using the asymmetry ratio R to determine the present order to asymmetrically sample the signals upon acquiring the data,
3) increasing the amount of the data by complex conjugation to obtain symmetrical data, and
4) filtering the data to reduce overshoot that causes Gibb's artifact using the pre selected filter characteristic, said filtering being a function of the number of samples actually acquired per evolving image using the asymmetrical sampling and conjugation.

In accordance with a related feature of the invention, the order of the series of encoding pulses in the first direction is $1/(1-2R)$. Where R is 0.28, for example, then approximately seven samples are taken on the major side of the asymmetry for each three samples on the other side, the minor side of the asymmetry. Preferably, after stabilization the zero point is sampled followed by the first two encoding pulses on the major side of the asymmetry, then the first sample of the minor side, followed by another two encoding pulses on the major side and another encoding pulse on the minor side. Then three pulses on the major side and one on the minor side, etc. A table is set up whereby for every seven encoding pulses on the major side of asymmetry three encoding pulses are taken on the minor side. For each image reconstruction, the filter $f_k$ will change as a function of the $N_A$ value. The filter function $f_{(k)}$ is also preferably tabulated.

In accordance with a further feature of the present invention, the step of optimizing the controllable parameters need only be accomplished once and comprises the steps of:
a) generating a table for each value of R that relates attenuation (A) of the overshoot causing the Gibbs artifact to the filter characteristic ($\alpha$), the relative SNR ($\beta$), and the relative resolution ($\gamma$) also defined as the relative width of the step response, and
b) selecting the values of $\alpha$ and R from the tables to obtain the maximum attenuation of the overshoot while the relative resolution $\gamma$ and $\beta$ are maintained substantially equal to one.

In accordance with an aspect of the invention, the relative resolution (shown by the relative width of the step response):

$$\gamma = (D/D_o)(1-R)$$

where:
D equals the frequency width for the step response of the filtered data;
$D_o$ equals the frequency width for the step response of the unfiltered data, (see FIG. 5), and
R is the sampling symmetry; i.e., the number of sampling points added by asymmetrical sampling and complex conjugation divided by the total number of sampling points obtained with asymmetrical sampling and complex conjugation; i.e., $(N_A-N_s)/N_A$.

In accordance with a related aspect of the invention, the relative SNR, $\beta$ is:

$$\beta = \left[\frac{N_z}{\sum_{N_A} |f_k|^2 + 2\sum_{N_z/2} f|k|^2}\right]^{\frac{1}{2}}$$

where:
$N_A$ is the number of sampling points using asymmetrical sampling and complex conjugation,
$N_s$ is the number of sampling points using symmetrical sampling,
$N_A-N_s$ is the number of sampling points added by asymmetrical sampling and complex conjugation,
$N_A/2$ is the number of sampling points obtained on the side of the major acquisition with asymmetrical sampling, and
$f_k$ is the filter function for each $N_A$ point,
where:

$$k=-(N_A-1)/2\ldots o\ldots +(N_A-1)/2 \text{ and } f_k=1 \text{ for } k=o.$$

Another aspect of the present invention is a method that provides optimal evolving images of a selected section of a patient in magnetic resonance imaging systems, said method comprising the steps of:

placing a patient being imaged in a large magnetic field, scanning a selected section of the patient by:

using a selecting gradient pulse to select a section of the patient for imaging, applying radio frequency (RF) pulses to generate signals in the selected sections, applying a series of phase encoding gradient pulses of different cross sectional areas prior to the receipt of each of said signals to enable obtaining projections of the signals in the direction of the phase encoding gradient starting with phase encoding gradients soliciting low spatial frequency imaging data and subsequently using phase encoding gradients soliciting high spatial frequency data, applying view gradient pulses during the receipt of said signals to enable obtaining projections of the signals in the direction of the view gradient, asymmetrically sampling the signals to obtain data in accordance with a series determined as a function of the asymmetry, increasing the amount of data by complex conjugation to obtain symmetrical data, filtering the symmetrical data to reduce artifacts with a filter that is a function of the number of phase encoding pulses that have been applied, and processing the filtered symmetrical data to obtain the evolving images during the acquisition procedure prior to applying half of the encoding pulses.

Yet another aspect of the present evolving image with minimal Gibbs artifact procedure comprises the steps of:

placing a subject for imaging in a large static magnetic field, scanning a selected section of said subject by:

applying a selecting gradient pulse during the application of an RF excitation pulse to select a section of the subject for excitation, said applied RF excitation pulses tipping protons in the selected section into a transverse plane to thereby instigate transmission of output signals from the selected section, locating the source of the output signals by:

applying a viewing gradient during the receipt of the output signals, applying one of a series of phase encoding pulses, each having different areas after the application of said RF pulses and prior to the receipt of each of said output signals, asymmetrically sampling in the phase encoding direction, complex conjugating the samples, and filtering the complex conjugated samples, and selecting the order of applying said phase encoding gradient pulses to implement the asymmetrical sampling as a function of a preselected ratio of asymmetry to minimize Gibbs artifacts emphasized by the limited data used in reconstructing the initial evolving images by asymmetrically sampling, complex conjugating and filtering.

According to a feature of the invention, the minimization of the Gibbs artifact includes the use of optimizing controllable parameters stored with the system and using planned phase encoding procedures tabulated for the selected asymmetry ratio parameter.

BRIEF DESCRIPTION OF THE DRAWINGS

The above named and other objects and features of the present invention will be best understood when considered in the light of the following detailed description of the invention made in conjunction with the accompanying drawings; wherein:

FIG. 1 is a generalized block diagram of an MRI system including a unique processing block;

FIG. 2 is a block diagram showing of the components of the unique processing block of FIG. 1;

GENERAL DESCRIPTION

Figure 3:
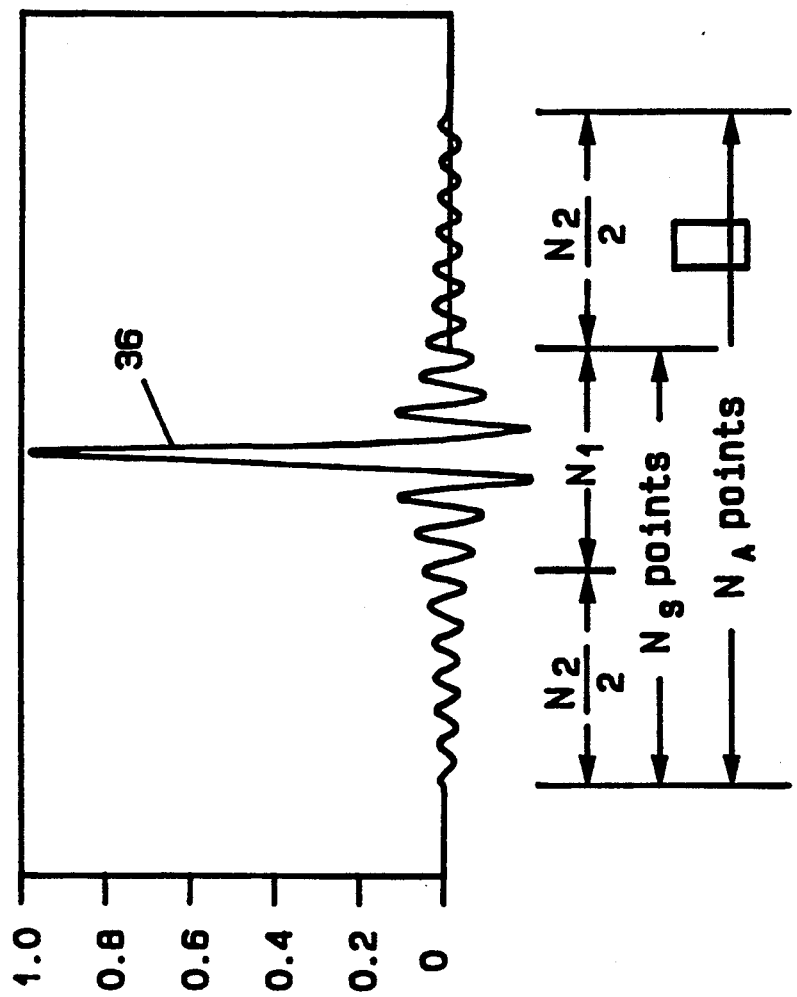
FIG. 3 is a graphical showing of asymmetrical sampling with conjugation.

Signals as acquired in MRI systems are functions of some morphological characteristics of the interior of the subject. The signal sources are located to enable reconstructing the image by placing data proportional to the signals in pixel locations corresponding to the locations of the signal sources in the body. MRI systems utilize many techniques for deriving images from the measured proton density at different locations in the body. Thus, while techniques and equipment described herein are preferred systems, many variations of the described techniques and equipment can be used within the scope of the invention.

The MRI system 11 of FIG. 1 includes the large magnet 12 for generating a large static magnetic field. The large magnet may be a resistance magnet, a permanent magnet or a superconducting magnet within the scope of the invention. In a preferred embodiment, a superconducting magnet is used.

Means shown as block 13 labelled "HO" is used for initially generating the electric current that magnetizes the static magnet 12. The large static magnetic field causes the protons in the subject placed within the magnet bore to be aligned in the direction of the static magnetic field.

Means are provided for selecting a portion in the subject for imaging. For example, Z gradient current generator 14 is shown attached to the magnet. It generates the Z gradient current which when flowing through the Z gradient coils varies the magnetic field along the Z axis enabling the selection of a planar portion of the subject parallel to the XY plane for imaging purposes. It should be understood that while orthogonal planar portion selection is described herein, the invention also encompasses line and/or volume portion selection as well as oblique section selection.

Means are provided for nutating or tipping the protons of the Z gradient selected planar portion in the subject into a transverse plane. More particularly, radio frequency (RF) transmitter means 16 are shown coupled to the main magnet 12. The transmitter means 16, in a preferred embodiment, transmits a shaped RF pulse to RF coils (not shown) in the main magnet. The RF pulse is generated by RF generator 17. The pulse may be shaped by modulator 18 through the use of a modulating frequency obtained from the modulating frequency generator 19.

Means such as Y gradient generator 21 and X gradient generator 22 are provided for obtaining proton density values for sections of the selected planar portion. The sections are defined by X, Y grids. In the preferred embodiment, the X gradient is the view gradient; i.e., applied during receipt of the output (FID) signals. This causes the signal spectrum to be a projection of the plane on the line of the X direction.

In a preferred embodiment, proton density values for the grid sections in the Y direction are obtained from the spectrum of the received signal phases which are located in the grid in the Y direction according to Y encoding pulses applied in a data acquisition procedure. Data is collected as a function of time and converted to a frequency function by a two-dimensional Fourier transform operation. The transform pair is:

$$S(t_x, t_y) = \int_{-\infty}^{\infty} \int_{-\infty}^{\infty} (W_x W_y) e^{-iW_x t_x} e^{-iW_y t_y} dW_x dW_y$$

$$(W_x, W_y) = \int_{-\infty}^{\infty} \int_{-\infty}^{\infty} (t_x, t_y) e^{iW_x t_x} e^{iW_y t_y} dW_x dW_y$$

Where:
S(tx,ty) are the pixel values on a two-dimensional time plane; i.e., dimension tx and ty.
(Wx,Wy) are the proton densities defined for the Larmor Wx, Wy frequencies determined by X and Y gradients respectively.

Thus, the pixel values where tx and ty are both equal to zero are:

$\int p(W_x, W_y) d_x d_y$—generally a maximum value.

The time or phase of the encoding gradient in a Y direction is kept constant per cycle and then changed for each succeeding cycle. In fact, a cycle is herein defined by the application of each succeeding encoding pulse; i.e., each change of the encoding pulse is another cycle. Each cycle provides specific values along the Y direction to locate the source of the signals in the two-dimensional Fourier plane.

It should be understood that while particular X, Y and Z gradients have been described, this description is by way of example only. Thus, the first gradient need not be the Z gradient; any of the gradients can be used for selecting the plane or volumes, for encoding and for viewing.

Means are provided for receiving the signals. More particularly, RF coils (not shown) in the main magnet are energized by the FID signals. These coils may be the same coils used for transmitting the RF nutating pulse, or they may be different coils. In a preferred embodiment, the same coils are used and a switching arrangement shown as switch SW1 or a duplexer is used to selectively determine the function of the coil; i.e., either for transmitting or receiving. When the coils are used for receiving, switch SW1 connects the coils to a receiver amplifier 23 and demodulator circuit 24. The output of the receiver circuit amplifier 23 is coupled to demodulator 24. The output of the demodulator is coupled to a unique processor 26.

Processor 26 processes the signals in the way to reduce artifacts and particularly to reduce the Gibb's artifact. The processor provides the data for the image shown on display unit 27 and/or for memory 28. The processor is under the control of the controller 29 which functions to control the timing and amplitudes of the various signals and gradients used throughout the system.

The FIG. 2 block diagram shows a preferred embodiment of the processor 26 comprising the illustrated component parts. For example, means such as an asymmetric analog-to-digital converter 41 is provided for asymmetrically sampling the signal received from the demodulator 24.

FIG. 3 shows the signal 36 as asymmetrically sampled. Therein, a number of samples $N_S$ are asymmetrically acquired from the received signal. The samples are then processed by complex conjugation to provide $N_A$ samples. If the number of symmetrical samples is 128, for example, 64 samples are taken on each side of the center of the signal peak along the zero ordinate with asymmetric sampling, the number of asymmetrical samples before conjugation is $N_S$, which is $N_A(1-R)$. These samples are shown as being basically acquired on one side of the center of the signal. The ratio of asymmetry R is equal to $(N_{A1}-N_S)/N_A$; R is less than ½ and is positive. Thus, if R is equal to 0.3, for example, and N is 128, then $N_A/2$ provides 64×1.3 or 83 samples. Further, after complex conjugation, the number of samples $N_A$ totals 166 which, of course, increases resolution, reduces the SNR and has no effect on the scan time.

Returning to the description of FIG. 2, the asymmetric sampling is generally done by unit 41. It could be done in either the time or in the phase encoding directions. More time is saved if the eccentric sampling is done in the phase encoding direction. The complete acquired data for example, comprises data in a 128×128 matrix obtained by acquiring and digitizing signal 36.

Complex conjugation unit 42 is used to generate data for a 128×166 matrix, for example. The output of the complex conjugator unit 42 is sent through a filter, such as a Kaiser filter 43, to aid in the removal of artifacts, and particularly to aid in removing the Gibb's artifact. The output of the Kaiser filter 43 is Fourier transformed by Fourier transform operator 44. In practice the Fourier transforming and/or filtering can be accomplished prior to complex conjugation within the scope of the invention. Further, in practice, the filter parameters are selected to optimize the reduction of the Gibb's artifact and to retain substantially the same resolution, SNR and scan time by also taking into account the improvement to resolution and the impairment of SNR caused by the complex conjugation step. Thus, filters other than the Kaiser filter can be used within the scope of the invention.

One of the variables utilized for maintaining the same resolution and approximately the same signal-to-noise level as obtained with regular symmetrical sampling is the selected sampling asymmetry ratio or factor R. This is chosen to effect the best compromise. The asymmetric sampling inherently degrades the SNR, The filter, on the other hand, improves the SNR. Consequently, the SNR is not significantly changed during processing to reduce the Gibb's artifact.

In the following explanation are equations which define a program for selecting an asymmetry factor Ropt, and filter characteristic $\alpha_{opt}$ that enables maintaining resolution and SNR while reducing the Gibb's artifact in an optimum manner.

The SNRi obtained by the unique imaging method described herein compared to the SNRp normally obtained by symmetrically sampling $N_s$ points is, therefore, given by:

$$\frac{SNR_i}{SNR_p} = \beta = \left[ \frac{N_z}{\sum_{N_A} |f_k|^2 + 2 \sum_{N_{z/2}} |f_k|^2} \right]^{\frac{1}{2}} \quad (1)$$

where $\beta$ in equation (1) is a function of filter characteristics $\alpha$ and assymetry ratio R. By selecting $\alpha$ and R such that $\beta \equiv 1$, the images obtained have the same SNR as the conventional prior art images.

In this description, the time domain filter used is a Kaiser filter which is a good filter for decreasing the Gibbs artifact.

For the Kaiser filter, $f_k$ is given by $$f_k = \begin{cases} \frac{I_0[\alpha \sqrt{1 - (2k/N_A)^2}]}{I_0(\alpha)} & k < N_A/2 \\ 0 & k > N_A/2 \end{cases} \quad (2)$$

where:

$I_0$ is the zero order modified Bessel function, $\alpha$ is the parameter of the filter that controls its shape and, therefore, the amplitude of the overshoot after filtering.

If the total sampling window of the time domain filter in equation (2) is one time unit, the Fourier Transform $F_T$ for the Kaiser filter is:

$$F_T(f) = \frac{\text{Sinh}[\alpha \sqrt{2 - (f/f_a)^2}]}{\alpha I_0(\alpha) \sqrt{(f/f_a)^2 - 1}} \quad (3)$$

where $f_a = \alpha/\pi$, f is frequency, and $I_0$ is the zero order modified Bessel function.

The step response $S_f(f)$ of the filter in the image domain for a sampling window of one time unit is:

$$S_f(f) = 2 \int_0^f F_T(f') df' \quad (4)$$

where: $F_f(f')$ is given by equation (3). See "The Fourier Transform and its Application" by R. Bracewell published by McGraw Hill (1965) pp. 209 et seq.

The step response $S_P(f)$ in the image domain of the unfiltered data can similarly be calculated for a sampling window of one time unit, using equation (5).

$$S_P(f) = 2 \int_0^f \frac{\text{Sin}(\pi f')}{(\pi f')} df' \quad (5)$$

where $\sin(\pi f')/\pi f'$ is the Fourier transform of a square window of unit time.

The step response $S_f(f)$ is calculated for any $\alpha$. The transition width D is defined as the frequency width required for the step response to rise from 10%-90% of the step. From $S_f(f)$, the value of D is evaluated for each $\alpha$. The same frequency width $D_o$ is calculated for the non-filtered prior art data from $S_P(f)$. The relative frequency width of the step response of the new method as compared to the old method is given by:

$$\text{relative width of step response} = \gamma = \frac{D}{D_o} (1 - R) \quad (6)$$

$D/D_o$ is multiplied by $(1-R)$, because the sampling window of the prior art acquisition is shorter by a factor of $(1-R)$ than the sampling window of the new imaging method. The value of in equation (6) must be close to 1, in order to obtain the same resolution in both methods.

A ratio $\delta$ is the ratio between the peak amplitude of the overshoot and the height of signal at the discontinuity. This ratio depends on the filter parameter $\alpha$, and can be obtained by calculating the step response $S_f(f)$ in equation (4). Kaiser (see Hamming "Digital Filters", p. 174) found an empirical equation that relates the filter parameter $\alpha$, with $\delta$. If we define A to be the ringing overshoot in decibels, then $$A = -20 \log_{10} \delta \quad (7)$$

According to Kaiser's equation:

$$\alpha = 0.5824(A-21)^{0.40} + 0.07886(A-21) \quad 21 \leq A < 50 \quad (8)$$

Using equation (8) $\alpha$ was calculated for each A. Note that when $\alpha = 0$, then $A = 21$ db and $\delta = 0.09$ which is the value for the unfiltered data.

For each value of R ($0 < R < 0.5$) a table such as Table I was generated. In each table the value of A was valued between 21 and 50 db. The filter characteristic a was calculated using equation (8). The relative SNR, ($\beta$) was calculated using equation (1). The relative width of the step response was calculated by using equation (6). In this manner for each R an optimal $\alpha$ ($\alpha_{opt}$) was selected, where both $\beta$ and $\gamma$ are approximately 1. Tables were generated for all Rs, the optimal R, $R_{opt}$, was selected based on which $\alpha_{opt}$ corresponded to the largest value of A. In this way the largest attenuation of Gibbs artifact was obtained, while the SNR and step response width were unchanged.

Among the tables generated was the following Table I which showed the optimum values. The table was determined for $R = 0.28$ and attenuations A ranging from $-22$ to $-40$ db. Based on Table I, the optimal $\alpha$ was found to be approximately 2.52, which corresponds to $A = 33$.

TABLE I

| db Atten. A | Filter Characteristic $\alpha$ | Relative SNR $\beta$ | Relative width of step response $\gamma$ |
|---|---|---|---|
| 22.0 | 0.6631 | 0.7088 | 0.7416 |
| 23.0 | 0.9286 | 0.7358 | 0.7672 |
| 24.0 | 1.1432 | 0.7622 | 0.7944 |
| 25.0 | 1.3326 | 0.7880 | 0.8216 |
| 26.0 | 1.5064 | 0.8131 | 0.8472 |
| 27.0 | 1.6694 | 0.8376 | 0.8744 |
| 28.0 | 1.8244 | 1.8612 | 0.9000 |
| 29.0 | 1.9730 | 0.8840 | 0.9256 |
| 30.0 | 2.1166 | 0.9060 | 0.9512 |
| 31.0 | 2.2560 | 0.9271 | 0.9768 |
| 32.0 | 2.3919 | 0.9473 | 1.0008 |
| 33.0 | 2.5248 | 0.9667 | 1.0248 |
| 34.0 | 2.6550 | 0.9854 | 1.0488 |
| 35.0 | 2.7829 | 1.0033 | 1.0712 |
| 36.0 | 2.9087 | 1.0205 | 1.0936 |
| 37.0 | 3.0327 | 1.0370 | 1.1160 |
| 38.0 | 3.1551 | 1.0529 | 1.1368 |
| 39.0 | 3.2759 | 1.0682 | 1.1592 |
| 40.0 | 3.3953 | 1.0830 | 1.1784 |

Thus, after calculating such tables for all Rs, the optical R; i.e., $R_{opt}=0.28$ was chosen. On this table $\beta$ and $\gamma$ are approximately 1 when $\alpha_{opt}$ is approximately 2.52, which corresponds to an attenuation A=33 db. This means that Gibbs artifact is reduced by 12 db or by a factor of 4, as compared to the prior art. These values; i.e., $R_{opt}$ and $\alpha_{opt}$ are universal and are stored in the system computers, to be used to reduce truncation artifacts.

Figure 4:
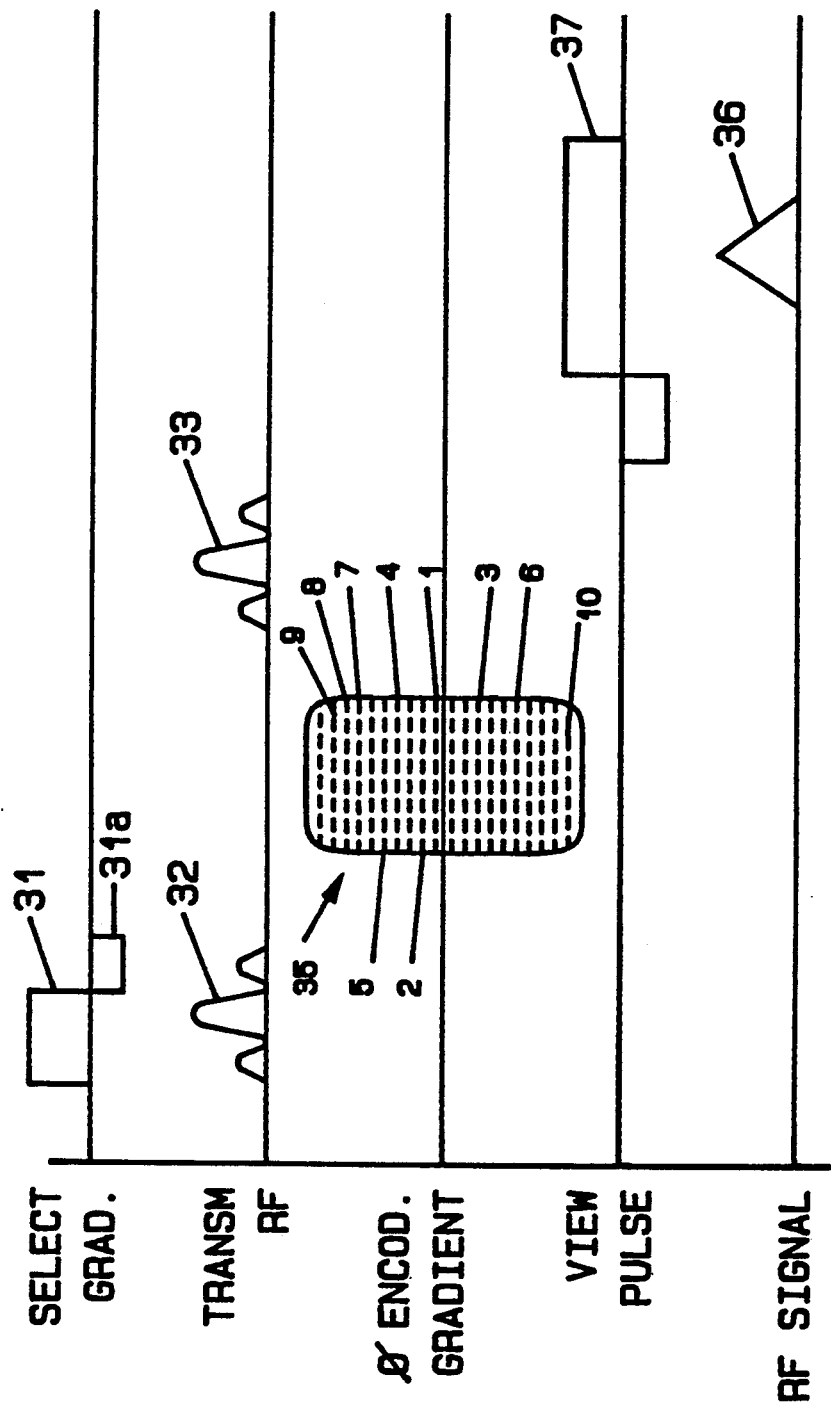
FIG. 4 shows one of the many possible sequences of phase encoding gradient pulses for use in evolving data acquisition with asymmetric sampling and conjugation according to the present invention, and FIG. 5 graphically illustrates the step response frequency widths D and $D_o$ used in equations herein.

FIG. 4 illustrates an imaging sequence used for the invention wherein the order of the encoding pulses are according to the present invention. As shown in FIG. 4 it is preferred that a gradient pulse 31 is applied while a 90° RF pulse 32 is transmitted.

Thus, a slab or slice along the Z axis having its major plane parallel to the XY plane is selected. The transmitting RF pulse 32 tips the protons in the selected slice. Subsequently, a 180° pulse 33 is applied to provide an "echo" 35. Phase encoding gradient pulses 36 are sequentially applied in a manner accomplishing the asymmetrical sampling indicated by $R_{opt}=0.28$, as shown in FIG. 4 starting with an encoding pulse labelled 1. Thus, as shown in FIG. 4, after the system has stabilized, the zero amplitude encoding gradient pulse is applied. This pulse provides a relatively large percentage of the image data.

With $R_{opt}=0.28$, a ratio of $1/(1-2R)$ or approximately 7 to 3 is used between the phase encoding pulses on the major asymmetrical side relative to the other side. Thus, the phase encoding pulses 1, 2, 4, 5 and 7, 8 and 9 are all shown on the plus side, etc.. The phase encoding pulses 3, 6 and 10 are shown on the minus side, followed by more pulses on the plus side. The ratio is not exactly 7:3, but that is a close estimate. The pulses could be applied 7 on the major side followed by three on the minor side et seq. A preferred ordering of the phase encoding gradient pulse is demonstrated in FIG. 4.

With each $N_A$ (as defined by FIG. 3), the value $f_k$ must be modified as in equation (2). This is easily accomplished since the optimized $\alpha$, $\alpha_{opt}$, is the same.

The positive and negative pulses could, of course, be reversed within the scope of the invention.

In FIG. 4, note that the received signal 35 is obtained during the application of a viewing gradient 37. As shown in FIG. 4, for example, the received signal is a spin echo signal.

Figure 5:
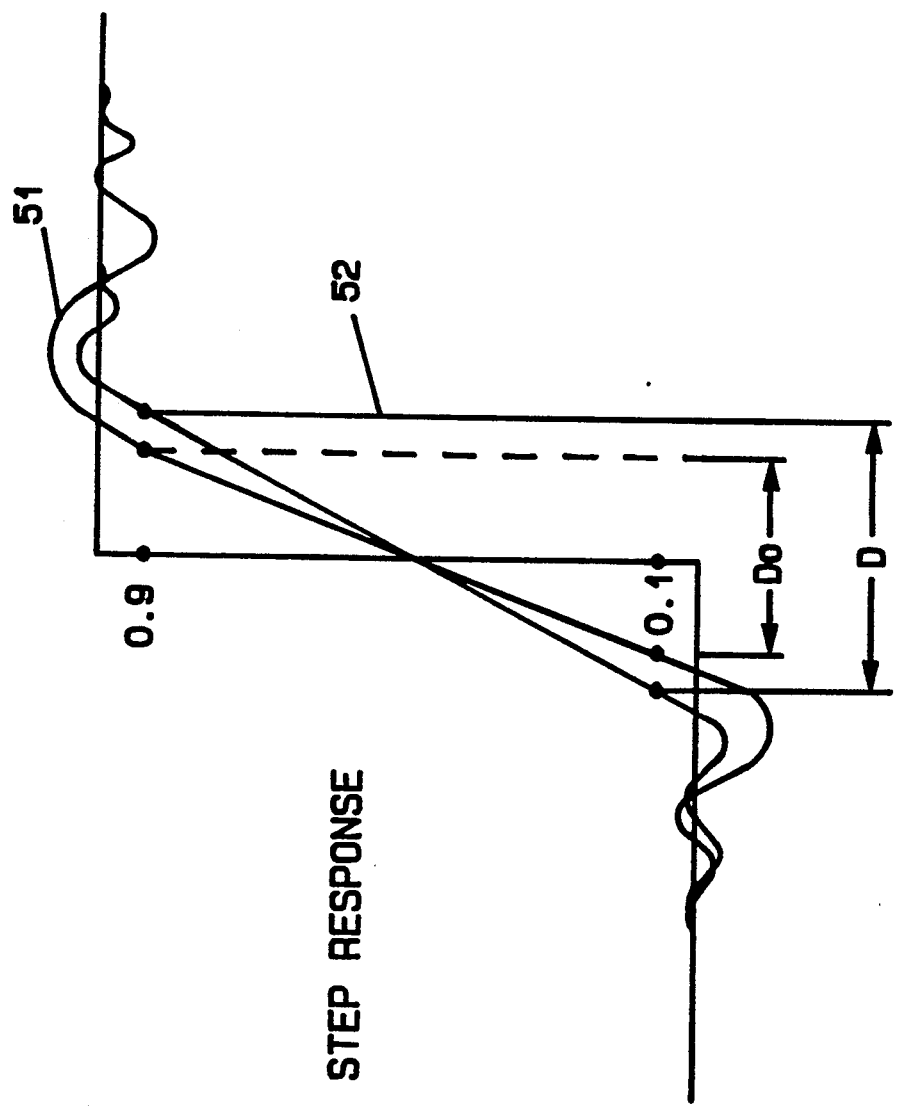

In FIG. 5, the signal 51 obtained by symmetrical sampling is shown as having a transition width $D_0$. The signal 52 obtained by asymmetrical sampling and conjugation is shown as having a transition width D.

With the evolving image, the resolution continues to increase as more data is added. By effectively removing the Gibbs artifact, the evolving images can be used much earlier in the evolution process. Also, if the patient moves, the operator upon noticing the movement artifact can remove data from the image; i.e., rollback the image until the movement caused artifact is removed. The capability reduces the need to rerun tests.

Thus, an evolving image process and system is provided wherein the artifacts are optimally reduced by a combination of asymmetrical sampling, complex conjugation and filtering using an optimal asymmetry ratio and an optimal filter.

While the invention has been described using certain embodiments, it should be understood that these embodiments are shown and described by way of example only, and not as a limitation to the scope of the invention.

What is claimed is:

1. A method for acquiring evolving image data with reduced Gibbs artifacts using a magnetic resonance imaging system, said method comprising the steps of:

acquiring magnetic resonance imaging data from a selected section of a patient, applying magnetic phase encoding gradient pulses to the patient for encoding data acquired from the selected section of the patient in a sequence that acquires data from a central section of a two-dimensional Fourier transform plane with a first group of phase encoding gradient pulses early in a scan to provide an evolving image having Gibbs artifacts, applying view magnetic gradient pulses to the patient, and using optimized controllable parameters stored in the system to reduce the Gibbs artifacts to increase the legibility of the evolving images for diagnostic purposes.

2. The evolving image method of claim 1 wherein the step of reducing the Gibbs artifacts to increase the legibility of the evolving image for diagnostic purposes comprises the following steps:

asymmetrically sampling the acquired data, complex conjugating of the asymmetrically sampled data to provide increased symmetrical data, filtering the increased symmetrical data to provide images having reduced Gibbs artifacts, and using as the optimized controllable parameters a filter characteristic and a ratio of asymmetry that will leave the SNR and the resolution of the system substantially unchanged.

3. An evolving image method for acquiring image data with reduced Gibbs artifacts using a magnetic resonance imaging system, said method comprising the steps of:

acquiring data from a selected section of a patient's body;

said acquiring step including:

applying magnetic phase encoding gradient pulses in a pre-set asymmetrical sequence to enable obtaining projections of the signal in the direction of the phase encoding gradient pulses starting with a first phase encoding gradient pulse that encodes spatial frequency imaging data from the central section of a two-dimensional Fourier transform plane.

applying view magnetic gradient pulses to enable obtaining projections with Gibb artifacts of the signals in the direction of the view magnetic gradient pulses;

increasing the amount of data by complex conjugation to obtain symmetrical data;

filtering the symmetrical data to decrease the Gibbs artifacts in the final image;

processing the filtered symmetrical data to obtain the evolving image with reduced Gibbs artifacts by the step of using a filter characteristic and a ratio of asymmetry that leave the system resolution unchanged.

4. The evolving image method of claim 3 wherein the step of applying phase encoding magnetic gradient pulses includes applying a first encoding gradient pulse after system stabilization at the center of the two-dimensional Fourier transform plane where the largest amount of spatial frequency data is elicited as compared to subsequent encoding gradient pulses.

5. The evolving image method of claim 4 wherein the order of and the preset asymmetrical sequence of the application of the phase encoding pulses is a function of the ratio of asymmetry (R), which is equal to the number of samples obtained by asymmetrical sampling and complex conjugation compared to the samples obtained by symmetrical sampling divided by the total number of samples acquired using asymmetrical sampling and complex conjugation.

6. The evolving image method of claim 3 where Gibbs artifact reduction is optimized by using a ratio of symmetry that is optimized to give a relative signal-to-noise ratio that is approximately equal to 1 and a relative resolution ratio that is approximately equal to 1; wherein the relative signal-to-noise ratio is equal to signal-to-noise obtained by normal symmetrical acquisition compared to signal-to-noise obtained by asymmetrical sampling, complex conjugation and filtering.

7. The evolving image method of claim 3 wherein a Kaiser filter is used for the filtering step.

8. The evolving image method of claim 5 wherein the sequence of the phase encoding pulses is derived as a function of $1/(1-2R)$.

9. The evolving image method of claim 7 including the step of correcting for motion artifacts when the operator notices motion artifacts by removing data from the images until the motion artifact no longer appears.

10. A method of initiating image reconstruction almost simultaneously with the commencement of image acquisition in MRI systems and nonetheless minimizing Gibbs artifacts to thereby maximize the legibility and diagnostic usefulness of even early evolving images, said method comprising the steps of:
  placing a subject for imaging in a static magnetic field,
  scanning a selected section of said subject by:
  applying a selecting gradient pulse during the application of an RF excitation pulse to select a section of the subject for excitation, said applied RF excitation pulse tipping protons in a selected section of the subject into a transverse plane to thereby instigate transmission of output signals from the selected section,
  locating the source of the output signals by:
  applying a viewing gradient during receipt of the output signals,
  applying one of a series of phase encoding pulses, each having different areas, after the application of said RF pulses and prior to the receipt of each of said output signals,
  asymmetrically sampling in the phase encoding direction,
  complex conjugating the samples,
  filtering the complex conjugated samples, and
  selecting the order of applying the phase encoding gradient pulses to implement the asymmetrical sampling as a function of a preselected ratio of asymmetry to minimize the Gibbs artifacts emphasized by the limited data used in reconstructing the initial evolving images.

11. The method of claim 10 wherein the Gibbs artifact is minimized by using optimized controllable parameters stored within the system.

12. An evolving image system for acquiring image data with reduced Gibbs artifacts using a magnetic resonance imaging system, said system comprising:
  a static magnetic field generator for applying a magnetic field to a patient in the system,
  a selection gradient source for applying a selecting magnetic gradient to the magnetic field,
  a radio frequency pulse source for applying a pulse to the patient in the system during the application of the selecting magnetic gradient to acquire data from a selected section of the patient,
  a phase encoding magnetic gradient source for applying phase encoding gradient pulses to the center section of a Fourier transform plane to provide an evolving image,
  a view magnetic gradient source for applying view magnetic gradient pulses to read out the evolving image data with Gibbs artifacts,
  a processor for reducing Gibbs artifacts to increase the legibility of the evolving images,
  an asymmetrical analog-to-digital converter for asymmetrically sampling the acquired data,
  a complex conjugator for complex conjugating the asymmetrically sampled data to provide increased symmetrical data,
  a filter for filtering the increased symmetrical data to provide images having reduced Gibbs artifacts,
  a memory containing optimal values of the ratio of asymmetry of the system and the filtered characteristic, and
  a processor for applying the optimal values to reduce the Gibbs artifacts while maintaining SNR and resolution of the image substantially unchanged.

13. An evolving image system for acquiring image data virtually free of Gibbs artifacts using a magnetic resonance imaging system, said system comprising:
  a gradient source, said gradient source including a select gradient source for providing select gradient pulses for acquiring data from a selected section of a patient's body;
  said gradient source providing phase encoding gradient pulses in a pre-set asymmetrical sequence to enable obtaining projections of the signals in the direction of the phase encoding gradient pulses starting with a first phase encoding gradient pulse applied to the center of a two-dimensional Fourier transform plane to elicit Gibbs artifact tainted spatial frequency imaging data sufficient to form an evolving image,
  a view magnetic gradient source for providing view magnetic gradient pulses to enable obtaining projections of the signals in the direction of the second gradient pulses;
  a complex conjugator for increasing the amount of date by complex conjugation to obtain symmetrical data;
  a filter for filtering the symmetrical data to decrease the Gibbs artifacts in the final image; and
  said filter having an optimum characteristic providing a Gibbs artifact free image without reducing SNR or image resolution.

14. The evolving image system of claim 13 wherein the phase encoding magnetic gradient source provides a first phase encoding gradient pulse after system stabilization to the center of the two dimensional Fourier transform plane.

15. The evolving image system of claim 14 wherein the order of the preset sequence of the application of the phase encoding pulses is a function of the ratio of asymmetry (R), which is equal to the number of samples acquired by asymmetrical sampling and complex conjugation compared to the number of samples acquired by symmetrical sampling divided by the total number of samples acquired using asymmetrical sampling and complex conjugation.

16. The evolving image system of claim 15 where Gibbs artifact removal is optimized by a table based on a ratio of asymmetry that is optimized to give a relative signal-to-noise ratio that is approximately equal to 1 and a relative resolution ratio that is approximately equal to 1; wherein the relative signal-to-noise ratio is equal to signal-to-noise obtained by normal symmetrical acquisition compared to signal-to-noise ratio obtained by asymmetrical sampling, complex conjugation and filtering.

17. The evolving image system of claim 13 wherein the means for filtering comprises a Kaiser filter.

18. The evolving image system of claim 15 wherein the sequence of the phase encoding pulses is derived as a function of $1/(1-2R)$.

19. The evolving image system of claim 17 including an image processor for correcting for motion artifacts when the operator notices motion artifacts by removing data from the images until the motion artifact no longer appears.

20. A system for initiating image reconstruction almost simultaneously with the commencement of image acquisition in MRI systems and nonetheless minimizing Gibbs artifacts to thereby maximize the legibility and diagnostic usefulness of even early evolving images, said system comprising:
  a static magnetic field generator for applying a static magnetic field to image a subject,
  a selecting magnetic gradient source for applying the selecting gradient pulse during the application of an RF excitation pulse to select a section of the subject for excitation, said applied RF excitation pulse tipping protons in a selected section of the subject into a transverse plane to thereby instigate transmission of output signals from the selection section,
  a magnetic view gradient source for applying a viewing gradient during receipt of the output signals,
  a source of magnetic phase encoding gradient pulses for applying a series of phase encoding pulses, each having different areas, after the application of said RF pulses and prior to the receipt of each of said output signals,
  an analog to digital converter for asymmetrically sampling in the phase encoding direction to acquire samples,
  a conjugator for complex conjugation of the samples,
  a memory for storing an optimum ratio of asymmetry and an optimum filter characteristic,
  a processor for applying the phase encoding gradient pulses to implement the asymmetrical sampling as a function of a pre-selected ratio of asymmetry for minimizing the Gibbs artifacts emphasized by the limited data used in reconstructing the initial evolving images.

* * * * *